United States Patent [19]

Imanishi

[11] Patent Number: 4,853,648
[45] Date of Patent: Aug. 1, 1989

[54] POWER AMPLIFIER CIRCUIT WITH A STAND-BY STATE

[75] Inventor: Kazuo Imanishi, Kanagawa, Japan

[73] Assignee: Kabushiki Kaisha Toshiba, Kanagawa, Japan

[21] Appl. No.: 215,482

[22] Filed: Jul. 6, 1988

[30] Foreign Application Priority Data

Jul. 13, 1987 [JP] Japan ............................. 62-172828

[51] Int. Cl.4 ........................... H03F 3/26; H03F 1/14
[52] U.S. Cl. ....................................... 330/273; 330/51
[58] Field of Search ................. 330/51, 124 D, 255, 330/262, 271, 273; 455/174, 194

[56] References Cited

U.S. PATENT DOCUMENTS 3,550,025 12/1970 Stodolsky ........................ 330/51 X
3,745,477 7/1973 Freeborn ............................ 330/271
4,041,408 8/1977 Trotnick, Jr. ................... 330/273 X
4,165,494 8/1979 Becker ............................ 330/262 X Primary Examiner—Steven Mottola
Attorney, Agent, or Firm—Finnegan, Henderson, Farabow, Garrett, & Dunner

[57] ABSTRACT

A power amplifier circuit comprises amplifier means, and mode switching means for selectively changing the amplifier means between an operational state wherein the input signal is amplified, and a stand-by state wherein the input signal is not amplified. The mode switching means includes timing means for delaying the change of the amplifier means to the stand-by state for a predetermined time after the stand-by state is selected, and means for supplying a predetermined potential to the amplifier means when the stand-by state is selected.

7 Claims, 3 Drawing Sheets

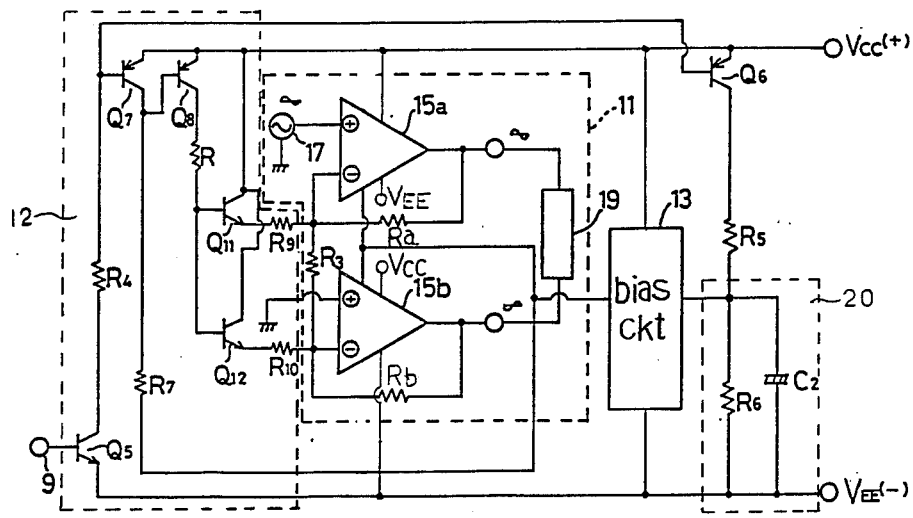
F I G. 5
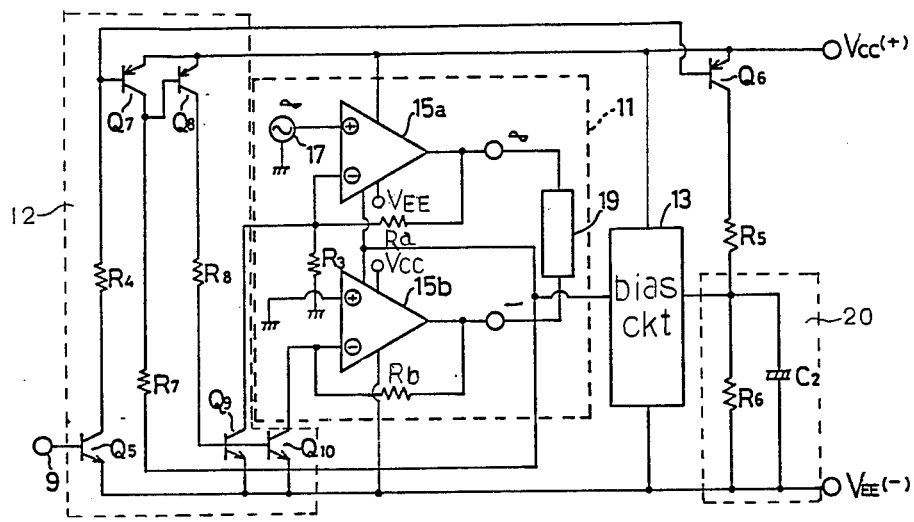
F I G. 6

POWER AMPLIFIER CIRCUIT WITH A STAND-BY STATE

BACKGROUND OF THE INVENTION

1. Field of the Invention

This invention concerns a power amplifier circuit having a stand-by mode and an operating mode.

2. Description of the Prior Art

A power amplifier circuit having a stand-by mode to reduce power consumption is known. In the stand-by mode, no current is supplied to a power amplifier circuit. FIG. 1 shows a conventional power amplifier circuit provided with a stand-by circuit to achieve a stand-by mode. The power amplifier circuit of FIG. 1 comprises an output stage 3, including bipolar transistors Q1 and Q2. The transistors Q1 and Q2 are connected in totem-pole configuration, and are driven by an output of an amplifier 1. The amplifier 1 is biased with power sources VCC(+) and VEE(−). An output of the output stage 3 is supplied to a load 5, e.g., an audio speaker.

The numeral 7 designates a bias circuit. The bias circuit 7 provides a bias current to the amplifier 1. In this circuit, an NPN transistor Q4, a PNP transistor Q3, the bias circuit 7 and the amplifier 1 constitute the stand-by circuit. The base electrode of the transistor Q4 is connected to a stand-by terminal 9, and the emitter electrode thereof is connected to the power terminal VEE. The PNP transistor Q3, the emitter electrode of which is connected to the power terminal VCC, supplies current to the bias circuit 7 and the amplifier 1. In the stand-by mode, the level of the signal at the stand-by mode terminal 9 is set to a low level. In this mode, the NPN bipolar transistor Q4 and the PNP bipolar transistor Q3 are in the OFF state, and the current supplied by the PNP transistor Q3 to the bias circuit 7 and the amplifier 1 is turned off. In this way, a stand-by state is achieved. With this stand-by mode or stand-by circuit, it is possible to turn the amplifier circuit ON or OFF without a large capacity switch on the power supplying line. Thus, the cost for producing the circuit can be reduced. Furthermore, by setting the threshold voltage of the stand-by circuit to a proper voltage, it is possible to control the stand-by circuit by a logic controller, micro-computer, etc. (not illustrated). Thus, use of the power amplifier circuit in an audio apparatus, for example as a muting circuit, becomes easier.

However, in this circuit, as the amplifier circuit changes from the operation state to the stand by state, at the moment when the stand-by mode is selected, a shock noise is generated. This shock noise sometimes causes an unpleasant noise when the circuit is used in a muting circuit.

FIG. 2 shows a conventional amplifier circuit designed to improve on the above defect. In this circuit, a timer circuit 10 is provided. Namely, the collector electrode of the transistor Q3 is connected to the power terminal VEE through resistors R1 and R2. a capacitor C1 is connected in parallel to the registor R2 to form a timer circuit 10. The bias circuit 7 is biased by the timer circuit 10, and the operation thereof is controlled by the timer circuit 10. Other parts designated by the same numeral as in FIG. 1 show corresponding parts.

In this circuit, when the stand-by mode is selected, the potential at the terminal 9 is set to a low level. In this condition, the transistors Q4 and Q3 are in the OFF state. Thus, a charge stored in the capacitor C1 during the operation mode is gradually discharged through the resistor R2. Therefore, the bias to the bias circuit 7 by the timer circuit 10 is gradually reduced. When the bias potential of the timer circuit 10 drops below a threshold level of the bias circuit 7, the bias circuit 7 changes to the OFF state and stops biasing the amplifier 1. In this way, the change from the operating state to the stand-by state is performed gradually, in accordance with the time constant C1.R2. By changing the amplifier 1 from the operation state to the stand-by state gradually, the shock noise is eliminated. However, in this circuit, as the amplifier circuit 1 changes to the stand-by state gradually, noise from a pre-amplifier (not shown) is amplified by the amplifier 1, during the change from the operation state to the stand-by state. Therefore, when the amplifier circuit is used in a muting circuit, a brief sound may be output during the muting operation.

SUMMARY OF THE INVENTION

Therefore, an object of this invention is to provide a power amplifier circuit which stops outputting immediately without producing any shock noise when the stand-by mode is selected. This invention provides a power amplifier circuit, comprising: amplifier means being responsive to first and second power sources, for amplifying an input signal and supplying the amplified input signal to a load; and mode switching means for selectively changing the amplifier means between an operational state wherein the input signal is amplified, and a stand-by state wherein the input signal is not amplified, including timing means for delaying the change of the amplifier means to the stand-by state for a predetermined time after the stand-by state is selected, and means for supplying a predetermined potential to the amplifier means when the stand-by state is selected.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. Of the drawings:

FIG. 5 is a circuit diagram of another embodiment of this invention.

FIG. 6 is a circuit diagram of a further embodiment of this invention.

DETAILED DESCRIPTION OF THE INVENTION

Figure 1:
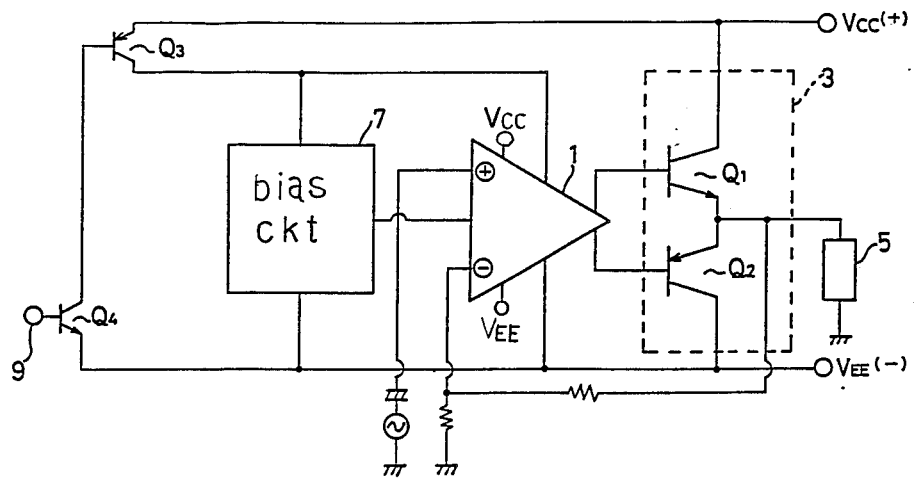
FIG. 1 is a circuit diagram of a conventional power amplifier circuit.
Figure 2:
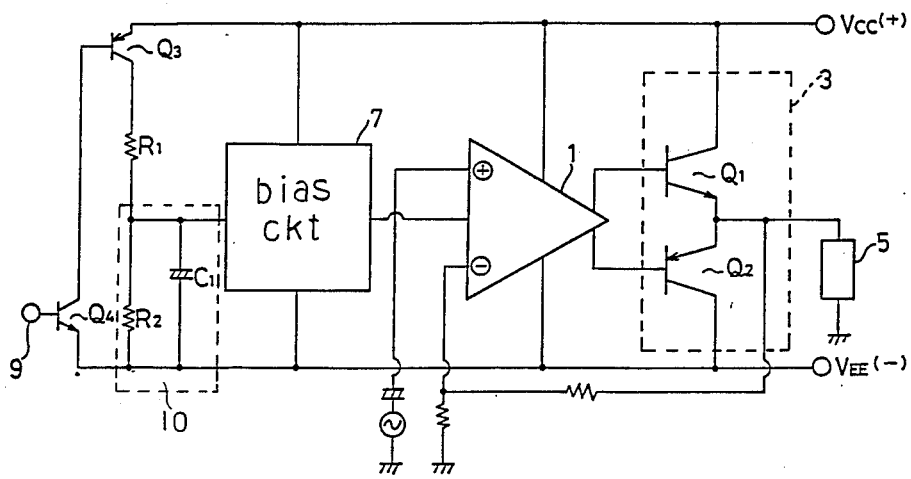
FIG. 2 is a circuit diagram of another conventional power amplifier circuit.
Figure 3:
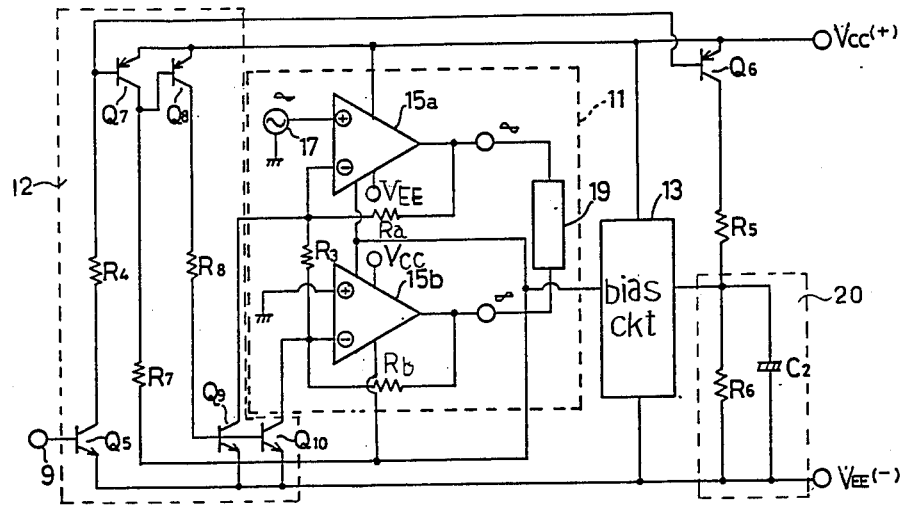
FIG. 3 is a circuit diagram of an embodiment of this invention.

FIG. 3 shows an embodiment of this invention. In the circuit, a numeral 11 designates an amplifier circuit section of a balanced transformerless (BTL) type configuration. The amplifier circuit section 11 includes a non-inverting amplifier 15a and an inverting amplifier 15b. Both amplifiers 15a and 15b have a non-inverting input terminal (+) and an inverting input terminal (−), respectively. The amplifiers 15a and 15b are biased with power sources VCC(+) and VEE(−).

A signal source 17 is connected to the non-inverting input terminal (+) of the non-inverting amplifier 15a. The non-inverting input terminal of the amplifier 15b is grounded. The output terminal of the amplifier 15a is connected to the inverting input terminal (−) through resistors Ra and R3. Thus, the amplifier 15b amplifies the input signal of the signal source 17, inversely. In this configuration, assuming that the open loop gains of the amplifiers 15a and 15b are very large, the voltage gains thereof are expressed as follows:

$$Ga = (Ra+R3)/R3 = (Ra/R3)+1 \quad (1)$$
$$Gb = -Rb/R3 \quad (2)$$

Wherein Ra, Rb and R3 are resistance values of resistors Ra, Rb and R3, respectively. Assuming that Ra=Rb, and Rb/R3>>1, the voltage gains Ga and Gb are expressed as follows:

$$|Ga| = |Gb| \quad (3)$$

Thus, in-phase and anti-phase outputs are obtained from the amplifiers 15a and 15b, and are supplied to the load 19.

In this circuit, the stand-by circuit includes an NPN transistor Q5, PNP transistors Q7 and Q8, resistors R5 and R6, a capacitor C2, and a bias circuit 13. The base electrode of the NPN transistor Q5 is connected to a stand-by mode terminal 9, and the collector electrode thereof is connected to the base electrode of the transistor Q7, through a resistor R4. The collector electrode of the transistor Q7 is coupled to the bias circuit 13 through a resistor R7. The base electrode of the transistor Q8 is connected to the collector electrode of the transistor Q7, and the emitter electrode thereof is connected to the power terminal VCC. The base electrodes of the transistors Q9 and Q10 are connected to the collector electrode of the transistor Q8 through a resistor R8, and the emitter electrodes thereof are connected to the power terminal VEE, respectively. The collector electrodes of the transistors Q9 and Q10 are connected to the inverting input terminal of the amplifiers 15a and 15b, respectively. The transistors Q5, Q7, Q8, Q9 and Q10 form a predetermined potential-supplying circuit 12, which supplies a predetermined potential to the amplifier circuit section 11 when the stand-by mode is selected. The base electrode of the transistor Q6 is connected to the base electrode of the transistor Q7, and the emitter electrode thereof is connected to the power terminal VCC. The collector electrode of the transistor Q6 is connected to the power terminal VEE through resistors R5 and R6. A capacitor C2 is connected in parallel to the resistor R6 to form a timer circuit 20. The bias circuit 13 biases the amplifiers 15a and 15b, e.g., by supplying a bias current to them. The operation of the bias circuit 13 is controlled by the timer circuit 20. Namely, after the predetermined time determined by the timer circuit 20, the bias circuit 13 stops biasing the amplifiers 15a and 15b.

In this circuit, in the operation mode, the potential level of the signal at the stand-by mode terminal 9 is a high level. Thus, the transistors Q5, Q7 and Q6 are in the ON state. Therefore, the transistor Q6 supplies a current to the bias circuit 13. Thus, the bias circuit 13 provides bias to the amplifiers 15a and 15b, to get a normal operation of the amplifiers 15a and 15b. In this state, the transistor Q9 and Q10 are in the OFF state, and do not affect the amplifiers 15a and 15b. On the other hand, when the stand-by mode is selected, the potential level of the stand-by mode terminal 9 becomes a low level. Thus, the transistors Q5, Q7 and Q6 change to the OFF state. In this state, the transistor Q6 does not supply current to the bias circuit 13. Therefore, the bias circuit 13 is biased by the timer circuit 20. In accordance with the discharge of the charge in the capacitor C2, the bias of the timer circuit 20 to the bias circuit 13 is gradually reduced.

On the other hand, as the transistor Q7 is in the OFF state, the transistors Q8, Q9 and Q10 change to the ON state. Thus, the inverting input terminals (−) of the amplifiers 15a and 15b are drawn substantially to the −VEE level so as to make the output levels thereof substantially the +VCC level. Therefore, even if the amplifiers 15a and 15b are operative being biased by the bias circuit 13, no amplified output is obtained at the load 19. Furthermore, as the potential levels of the both sides of load 19 change simultaneously to substantially the same level, no shock noise is produced at the change from the operation mode to the stand-by mode. As the current from the transistor Q6 to the capacitor C2 is turned off, the charge in the capacitor C2 is discharged through the resistor R6, gradually. When the potential at the connection of the resistors R5 and R6 drops below the threshold level of the bias circuit 13, the bias circuit 13 changes to the OFF state. Thus, the bias circuit 13 stops biasing the amplifiers 15a and 15b. The amplifier 15a and 15b changes from the operation state to the stand-by state a predetermined time after the stand-by mode is selected. In this power amplifier circuit, when the stand-mode is selected, the output is immediately stopped so as to prevent the shock noise, and power consumption is reduced because of the stand-by state.

Figure 4:
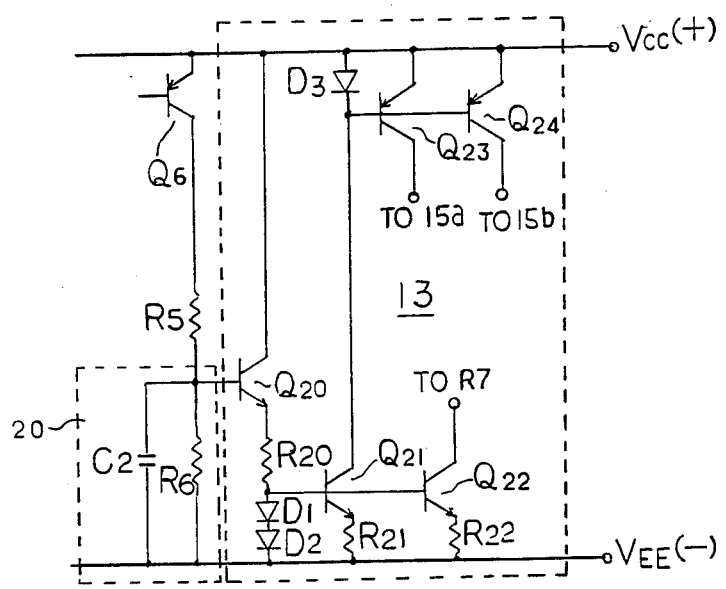
FIG. 4 is a circuit diagram of a bias circuit used in the power circuit of this invention.

FIG. 4 is a circuit diagram of an example of the bias circuit 13 of FIG. 3. The bias circuit 13 includes an NPN transistor Q20. The base electrode of the transistor Q20 is connected to the common connection of the resistors R5 and R6. The emitter electrode of the transistor Q20 is connected to the power terminal VEE through a resistor R20 and the diodes D1 and D2. The common connection of the resistors R20 and the diode D1 gives a proper bias to the base electrodes of the transistors Q21 and Q22. The emitter electrodes of the transistors Q21 and Q22 are connected to the power terminal VEE through resistors R21 and R22, respectively. The collector electrode of the transistor Q21 is coupled to the power terminal VCC via diode D3. The common connection of the diode D3 and the collector electrode of the transistor Q21 gives a proper bias to the transistors Q23 and Q24, respectively. The collector electrodes of the transistors Q23 and Q24 are coupled to the amplifiers 15a and 15b, and provide bias current to the amplifiers, respectively. The collector electrode of the transistor Q22 is connected to the resistor R7. When the stand-by mode is selected, the transistor Q6 turns OFF and stops supplying current to the bias circuit 13. In this state, the discharge of capacitor C2 through the resistor R6 begins. In accordance with the discharge of the capacitor C6, the voltage potential at the common connection of the resistors R5 and R6 decreases gradually. When the potential falls below the treshold level which make the transistor Q20 turn ON, the transistors Q21 to Q24 also change to the OFF state. Thus, supplied the current to the amplifiers 15a and 15b gradually decreases, and stops after a predetermined time determined by the time constant C2.R6 of the timer circuit 20. When the transistor Q22 is in the OFF state, namely when the bias circuit 13 is OFF state, the transistor Q8 also is in the OFF state.

FIG. 5 is a circuit diagram of another embodiment of this invention. In this circuit diagram, the same numerals designate the same parts with respect to the embodiment of FIG. 3. In this circuit, the output levels of the amplifiers 15a and 15b are forced to have substantially the −VEE level, respectively. Namely, in this circuit, the base electrodes of transistors Q11 and Q12 are connected to the collector electrode of the transistor Q8 through a resistor R. The emitter electrodes of the transistors Q11 and Q12 are connected to the inverting-input terminal (−) of the amplifiers 15a and 15b through resistors R9 and R10, respectively. Thus, in the case where the transistor Q8 is in the ON state, namely when the stand-by mode is selected, the transistors Q11 and Q12 change to the ON state and provide the +VCC potential to the inverting input terminals (−) of the amplifiers 15a and 15b. Thus, the output levels of the amplifiers 15a and 15b become substantially the −VEE potential. Therefore, no amplified output is obtained at the load 19. The change from the operation state to the stand-by state is gradually performed similarly to the embodiment of FIG. 3, when the stand-by mode is selected.

FIG. 6 is a circuit diagram of a further embodiment of this invention. In this circuit, the inverting input terminal (−) of the amplifier 15b is not supplied with the input signal from the amplifier 15a. Thus, the amplifier 15b functions only to supply a predetermined bias potential, e.g., a ground level, to the load circuit 19. Thus, the amplifier circuit section 11 functions as a single amplifier. In this circuit, when the stand-by mode is selected by supplying a low level signal to the stand-by mode terminal 9, the transistors Q8, Q9 and Q10 are in there ON state. Thus, the potential of the inverting input terminals (−) of the amplifiers 15a and 15b are forced substantially to the −VEE potential. Therefore, the output level of the amplifiers 15a and 15b are forced to have the +VCC potential level as the output. In the foregoing embodiments, the two bias sources +VCC and −VEE are used. However, it is possible to operate the amplifier circuit between a +VCC potential level and a ground level, or a ground level and a −VEE level.

The present invention has been described with respect to specific embodiments. However, other embodiments based on the principles of the present invention should be obvious to those of ordinary skill in the art. Such embodiments are intended to be covered by the claims.

What is claimed is:

1. A power amplifier circuit, comprising:
   amplifier means responsive to a first power source of a first potential and a second power source of a second potential, for amplifying an input signal and supplying the amplified input signal to a load; and
   mode switching means for selectively changing the amplifier means between an operational state wherein the amplifier means is supplied with a bias current and the input signal is amplified, and a stand-by state wherein the bias current to the amplifier means is turned off and the input signal is not amplified, including bias means for supplying the bias current to the amplifier means, timing means for delaying the change of the amplifier means to the stand-by state for a predetermined time after the stand-by state is selected by turning off the bias current to the amplifier means after the predetermined time, and means for supplying a predetermined potential to the amplifier means in response to the selection of the stand-by state.

2. The power amplifier circuit of claim 1, wherein the amplifier means includes a non-inverting amplifier circuit means biased by the first and the second power sources for amplifying the input signal, and an inverting amplifier circuit means biased by the first and the second power sources for amplifying the input signal.

3. The power amplifier circuit of claim 2, wherein the non-inverting amplifier circuit means includes a non-inverting input terminal and an inverting input terminal.

4. The power amplifier of claim 3, wherein the timing means includes a timer circuit for gradually reducing the bias current to the amplifier means.

5. The power amplifier circuit of claim 2, wherein the non-inverting amplifier amplifier circuit means and the inverting amplifier circuit means each includes an inverting input terminal and a non-inverting input terminal.

6. The power amplifier circuit of claim 2, wherein the supplying means includes transistor means for limiting the predetermined potential to a level substantially equal to the potential of one of the first and second power sources.

7. A power amplifier circuit, comprising:
   amplifier means responsive to a first power source of a first potential and a second power source of a second potential, for amplifying an input signal and supplying the amplified input signal to a load, the amplifier means including a non-inverting amplifier circuit means biased by the first and the second power sources for amplifying the input signal and an inverting amplifier circuit means biased by the first and the second power sources for amplifying the input signal; and
   mode switching means for selectively changing the amplifier means between an operational state wherein the input signal is amplified, and a stand-by state wherein the input signal is not amplified, including timing means for delaying the change of the amplifier means to the stand-by state for a predetermined time after the stand-by state is selected, and means for supplying a predetermined potential to the amplifier means when the stand-by state is selected, the supplying means including transistor means for limiting the predetermined potential to a level substantially equal to the potential of one of the first and second power sources.

* * * * *